United States Patent [19]
Behrend

[11] 3,956,715
[45] May 11, 1976

[54] AMPLITUDE MODULATION SYSTEM

[75] Inventor: William Louis Behrend, Pittsburgh, Pa.

[73] Assignee: RCA Corporation, New York, N.Y.

[22] Filed: Dec. 23, 1974

[21] Appl. No.: 536,005

[52] U.S. Cl. ................................. 332/1; 325/136; 332/41; 332/45
[51] Int. Cl.$^2$ ..................... H03C 1/50; H03C 1/60
[58] Field of Search .................. 332/41, 31 R, 31 T, 332/45, 1; 325/49, 50, 136; 358/23–25

[56] References Cited
UNITED STATES PATENTS

| | | | |
|---|---|---|---|
| 3,176,246 | 3/1965 | Boiten | 332/23 X |
| 3,229,232 | 1/1966 | Sosin | 332/45 |
| 3,443,229 | 5/1969 | Becker | 325/136 X |
| 3,737,809 | 6/1973 | Parkyn | 332/41 X |

*Primary Examiner*—Siegfried H. Grimm
*Attorney, Agent, or Firm*—Edward J. Norton; Robert L. Troike

[57] ABSTRACT

An amplitude modulation system suitable for use in television broadcasting is described including phase modulating means for phase modulating a carrier signal with an input signal to provide a first phase modulated signal having a phase according to the arc cosine of the amplitude of the input signal with the input signal normalized with unity at the maximum possible level thereof, the phase modulating means providing a second phase modulated signal having a phase according to the minus arc cosine of the amplitude of the input signal with the input signal normalized with unity at the maximum possible level thereof. The phase modulated output signals from the first and second modulators are processed over separate paths each including a delay equalized vestigial sideband filter. The two filtered, phase modulated signals processed over the two paths are amplified and then combined to provide an amplitude modulated, vestigial sideband filtered signal.

6 Claims, 3 Drawing Figures

AMPLITUDE MODULATION SYSTEM

BACKGROUND OF THE INVENTION

This invention relates to amplitude modulation systems and more particularly to vestigial sideband amplitude modulation systems such as are used in television broadcasting transmitters.

It has been found in efforts to use present state-of-the-art solid state linear amplifiers in the low-level drive stages of a television transmitter that these solid state amplifiers produce large amounts of incidental, unwanted phase modulation. It has been suggested that, by the use of a phase-to-amplitude modulation system, amplifiers with a greatly reduced linearity requirement can be used in the low-level drive stages.

A phase-to-amplitude modulation system is described in a paper published in the Electronics Magazine of September 1950 on pages 102 through 106. The paper is entitled "Phase to Amplitude Modulation" and is by William E. Evans, Jr. Although Evans suggests this type of system for television broadcasting, applicant knows of no use of this form of modulation in television broadcasting other than the referenced experimental use. Evans does not discuss the use of vestigial sideband filtering, and, since such filtering is conventionally done at high power levels just before coupling to the antenna, it is assumed that Evans contemplated the provision of sideband filtering at high power levels after the combiner. As will be discussed, it is desirable, particularly from the standpoint of filter cost and/or performance, that vestigial sideband filtering be done at a low power level. Further it is desirable that all signal processing be done at a fixed frequency with translation to final television channel frequencies. This approach permits the use of a common signal processor for all television channels, lowering total cost and increasing reliability.

SUMMARY OF THE INVENTION

Briefly, a vestigial sideband amplitude modulation system is provided by phase modulating a radio frequency carrier signal at a first phase modulator to have a phase determined according to the arc cosine of the amplitude of the modulating signal with the modulating signal normalized with unity at the maximum possible input level thereof. The radio frequency carrier signal is phase modulated at a second phase modulator to have a phase determined according to the minus (−) arc cosine of the amplitude of the modulating signal with the modulating signal normalized with unity at the maximum possible input level thereof. The two separate phase modulated signals are separately filtered by identical delay equalized vestigial sideband filters and applied to a combiner. At the combiner, the two vestigial sideband filtered signals are combined to form a delay equalized vestigial sideband filtered amplitude modulated output signal.

DETAILED DESCRIPTION OF A PREFERRED EMBODIMENT

Figure 1:
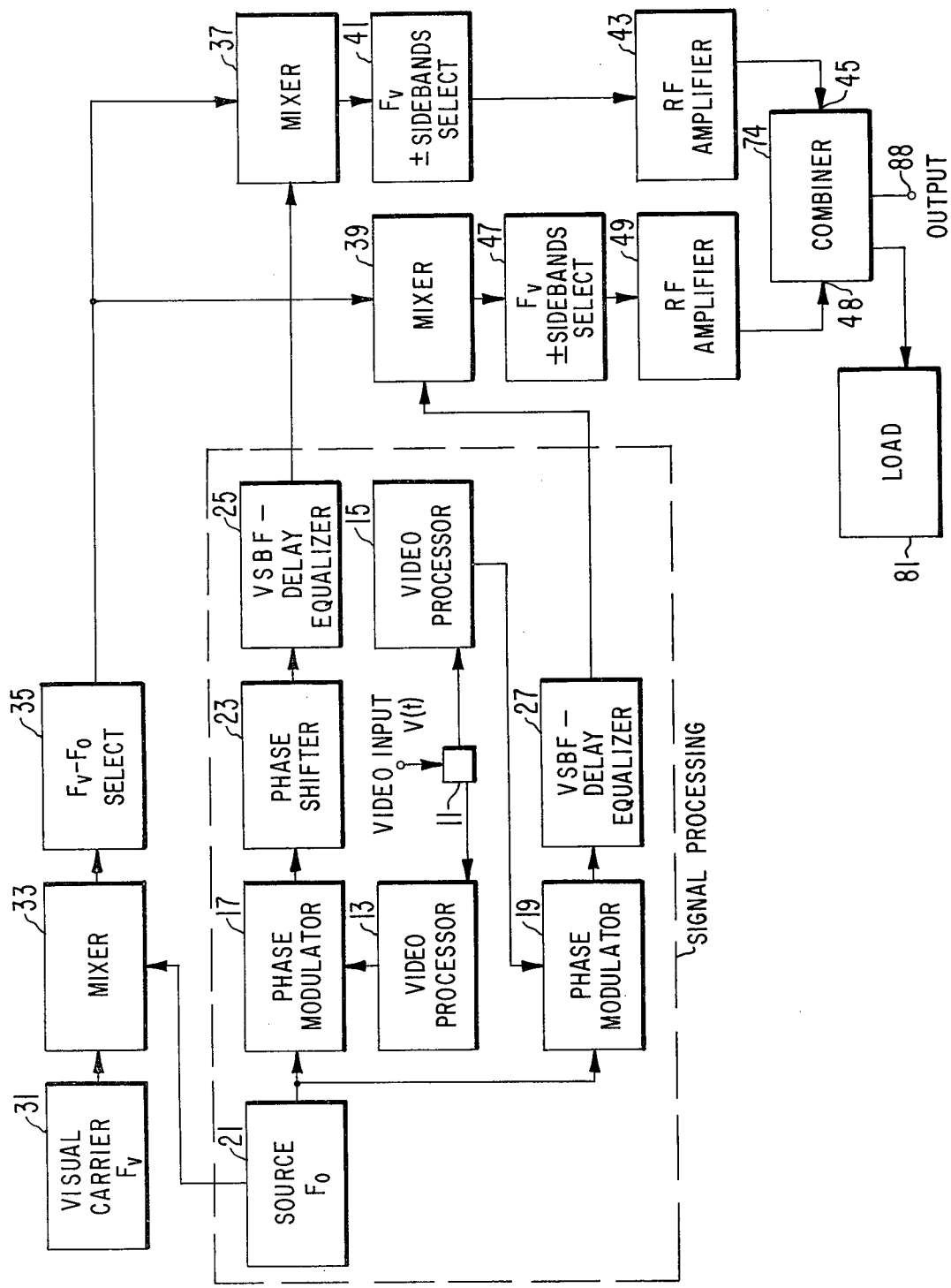
Figure 2:
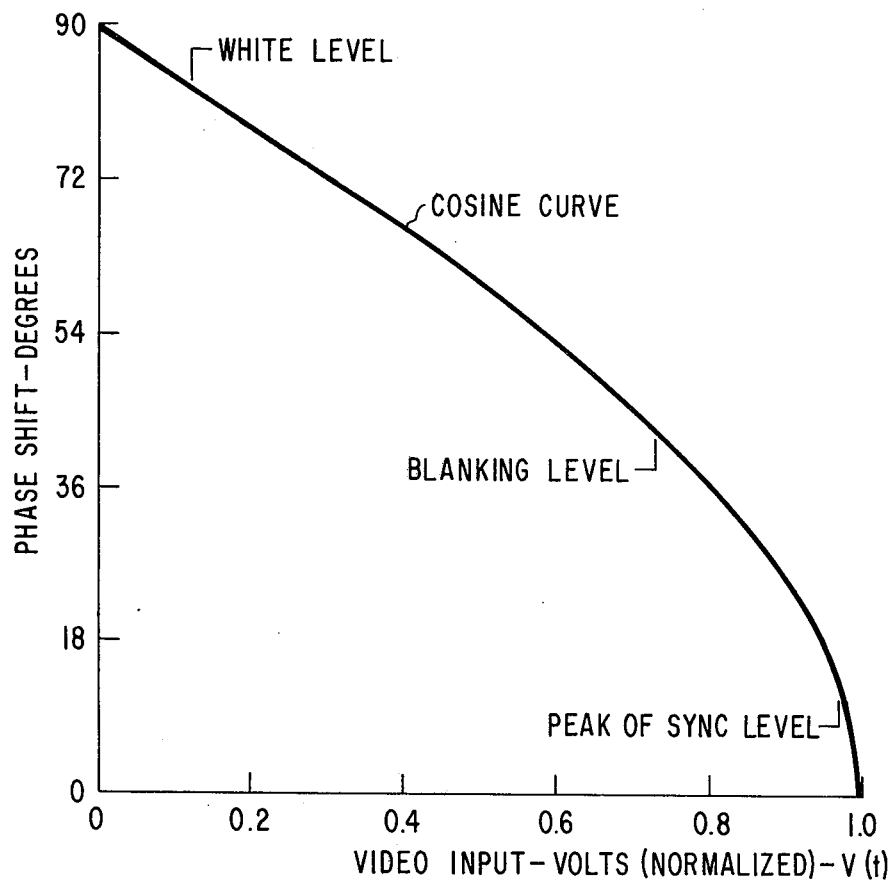
Figure 3:
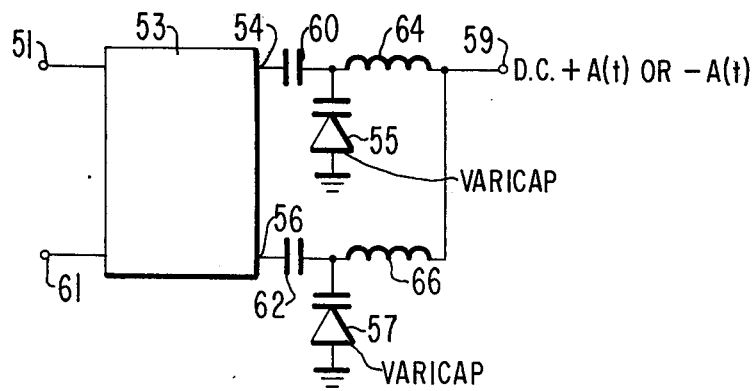

A more detailed description follows in conjunction with the drawing wherein:

FIG. 1 is a block diagram of an amplitude modulation system according to one embodiment of the invention, FIG. 2 is a plot of phase shift vs. video input to a video processor with the video input normalized with unity at the maximum possible input level thereof, and FIG. 3 is a schematic of a phase modulator useable in the embodiment of FIG. 1.

The phase-to-amplitude modulation system described herein includes two identical phase modulators driven from a common input signal source and having their outputs fed to a common output load such as an antenna. The common source may supply, for example, a signal amplitude varied by video information. For the amplitude peaks of the input amplitude signal, the phase modulated outputs from the two modulators will combine in phase or nearly in phase, and a maximum amount of RF output power is delivered at the antenna. For the amplitude troughs, the phase modulated outputs swing out of phase so that the phase modulated signals when combined effectively cancel. The maximum possible output from the system at the antenna occurs when the two phase modulated signals combine with a substantially 0° relative phase difference, and the minimum output occurs at the antenna when there is a substantially 180° relative phase difference.

Referring to FIG. 1, the video input signal (represented at V(t)) is equally divided by power divider 11 and is applied through separate video processors 13 and 15 to separate phase modulators 17 and 19. Radio frequency carrier signals at a frequency $f_0$ (16 MHz for example) from a source 21 are applied to phase modulators 17 and 19. The video processor 13 provides an output signal A(t) for a given input signal V(t) such that the phase shift produced at phase modulator 17 is the arc cosine of the amplitude level of the original video signal V(t) with the input video signal normalized with unity at the maximum possible input level thereof (arc cos V(t)). The video processor 15 provides an output signal −A(t) for an input video signal V(t) such that the phase shift produced at the phase modulator 19 is the minus (−) arc cosine of the amplitude level of the video signal V(t) with the input video signal normalized with unity at the maximum possible input level thereof (−arc cosine V(t)).

Referring to FIG. 2, there is illustrated a plot of phase shift in degrees at a phase modulator for a signal V(t) at the input with the signal V(t) normalized with unity at the maximum possible input level thereof. This maximum possible input is that level discussed previously at the input causing 0° relative phase difference between the two phase modulated signals and causing maximum possible output from the system. At the other extreme, a 90° relative phase shift (180° phase difference between the two signals) would result with signal V(t) equal to zero (0% modulation) and there would be zero output from the system.

It may not be desirable to design the system to perform at this maximum possible power output (where phase difference is 0°) because of the rapid change in phase vs. video input level (video shaping) as the maximum input level is approached. In such a case, the maximum power at peak-of-sync, for example, may be set so that a relative phase difference of 30° between the two signals rather than zero degrees results at the combiner of the system, with a 6.77 percent of the power at the reject load of that combiner rather than zero. The peak-of-sync level, blanking level and white level are at the points indicated in FIG. 2 for this case where there is 30° phase difference between the signals at peak-of-sync. As the amplitude of the input video signal V(t) increases from zero to maximum normalized at unity, the phase shift produced at phase modulator 17 goes from 90° at zero amplitude to 0° at unity. As the amplitude of the input video signal V(t) increases from zero to maximum normlized at unity, the phase shift produced at modulator 19 goes from −90° to 0°.

The video processor 13 and the video processor 15 to achieve the described phase shift at the respective phase modulators do so, for example, by the combination of parallel series circuits with each circuit consisting of a diode in series with a resistor. The diodes are biased to conduct at different signal levels. With all diodes conducting, the load resistance is a minimum and it is maximum with all diodes non-conducting. In a preferred embodiment, there are eight series circuits each of a diode in series with a resistance and each one adjusted to conduct at different signal levels. Six of these series circuits are at fixed biases and two of them at adjustable biases. The adjustable biases are placed at each end of the characteristic such as at the white signal level end and the peak-of-sync signal level end. The adjustable biases are to accommodate for the curvature in the phase versus voltage characteristic of the phase modulator which follows. Other examples of similar circuits which may be used in the video processing can be found in the following references: Television Engineering Handbook by D. Fink, p. 5–50, McGraw Hill; Fundamentals of Television Engineering by Glenn M. Glassford, p. 500, McGraw Hill, and Introduction to Solid-State Television Systems by Gerald L. Hansen, p. 137–138, Prentice-Hall.

The phase modulators 17 and 19 may be of the type shown in FIG. 3. The input RF signal of sin $\omega_o(t)$ at input terminal 51 from source 21 is coupled to a 3 db, 90° coupler or quadrature coupler 53. One half of the signal is coupled out of port 54 and one half of the signal is coupled out of port 56. The one half of the signal that is coupled out of port 54 is applied via coupling capacitor 60 across a variable capacitor diode 55, and the one half of the signal coupled out of port 56 with a 90° difference in phase is applied through coupling capacitor 62 across variable capacitor diode 57. The diodes 55 and 57 are always back biased by a D.C. signal coupled via terminal 59. Also applied to terminal 59 is either the +A(t) or −A(t) signal discussed above. Inductances 64 and 66 in the circuit are arranged to isolate the RF circuit from the video circuits (RF choke). The variable capacitor diodes cause a phase shift of the input RF signal as a function of either the +A(t) or −A(t) signal as discussed previously, and the total signal is coupled through the coupler 53 to output terminal 61. The coupling capacitors 60 and 62 serve to isolate the D.C. bias from the RF circuits. It is desirable that a type of phase modulator be used that provides constant group delay such as the dispersive type illustrated. A further description of this dispersive phase modulator may be found in a book entitled "Microwave Semiconductor Devices and their Circuit Applications" edited by H. A. Watson and published by McGraw Hill. The dispersive phase modulator is more specifically described on pages 331–334.

The phase modulated output from phase modulator 17 is passed through a phase shifter 23 to vestigial sideband filter 25. The phase shifter 23 is used to set the proper steady state phase between the outputs from the two phase modulators 17 and 19. The phase shifter 23 may be of the dispersive type as discussed in the previously cited book by H. A. Watson entitled "Microwave Semiconductor Devices and their Circuit Applications."

The vestigial sideband filter (VSBF) 25 may, for example, be a seven pole Chebyshev type filter with the 1 db bandwidth extending from 0.62 MHz below (−.62 MHz) the carrier to 4.18 MHz above the carrier, with the 3 db bandwidth from 0.72 MHz below the carrier to 4.75 MHz above the carrier, and with the 19 db bandwidth extending from −1.25 MHz to 4.75 MHz. It is also important that the group delay through the filter be equalized over the band of frequencies. This may be achieved by the filter including an eight section equalizer having a response characteristic with a tolerance of less than ± 20 nanoseconds over the band of frequencies from 0.5 MHz below the carrier to 4.0 MHz above the carrier frequency and by a tolerance of less than ± 40 nanoseconds over the frequencies from 0.75 MHz below the carrier frequency to 4.1 MHz above the carrier frequency. Similarly, the output from phase modulator 19 is coupled through a vestigial sideband filter and delay equalizer 27 which is identical to filter 25. All of this processing can be done at a fixed frequency in a processor indicated by that portion surrounded by dashed lines. To raise the output signal to a desired carrier frequency, $F_V$, the output from filters 25 and 27 are converted to $F_V$ before being combined at combiner 74.

Carrier frequency signals at $F_V$, 61.25 MHz for example, from a source 31 are mixed at mixer 33 with signals at $F_0$ from source 21. The resulting difference signals at $F_V − F_0$, 45.25 MHz for example, are passed through select filter 35 and are applied to mixers 37 and 39. Also applied to mixer 37 is the filtered output from phase modulator 17. The output signals from mixer 37 at frequencies $F_V$ ± sidebands are passed through select filter 41, are amplified by radio frequency amplifier 43 and coupled to terminal 45 of combiner 74. Also applied to mixer 39 is the filtered output from phase modulator 19. The output signals from mixer 39 at frequencies of $F_V$ ± sidebands are passed through select filter 47, are amplified by radio frequency amplifier 49 and are applied to terminal 48 of combiner 74. Since the information is primarily carried in the signal phase, the amplifiers 43 and 49 are not required to amplify a signal with a large percentage of AM modulation, avoiding the above discussed disadvantages in using linear amplifiers at the low-level drive stages of the system. The filters 41 and 47 may be 4-pole chebyshev type filters. At the combiner 74, the power is shifted between the output terminal 88 and the dummy load 81 in accordance with the relative phase between the signals applied to the combiner 74. This combiner may in a preferred embodiment be an RCA 50 ohm coaxial coupler (crossover type) M1-561536A purchased from RCA Corporation, Camden, New Jersey. In this type of coupler, one of the two input signals undergoes an extra −90° relative phase shift. An allowance for this may be had at the phase shifter 23.

As mentioned previously, the adjustable phase shifter 23 is used to set the proper steady state phase between the first path through phase modulator 17 and the second path through phase modulator 19. The steady state adjustment is correct if, when the input video signal amplitude V(t) is zero (0% modulation), the two signals at the combiner output are effectively 180° out of phase and the combiner output is zero. Also, as the input signal amplitude increases, the phase difference between the two signals at the combiner 74 output should decrease, causing the combiner output 74 to increase. This phase shifter 23 may be of a dispersive type as used for phase modulators 17 and 19.

The invention provides a transmitter modulation system having a number of features; namely, power amplification of a phase modulated signal; delay equalized vestigial sideband filtering at a low power level; sideband shaping at fixed frequency removes the necessity for a video low-pass filter at the transmitter input; all signal processing is done at a fixed frequency with translation to final television channel frequency; and, removal of any frequency variations of signal processing carrier to provide simpler precise frequency control of the final television carrier frequency. By the use of the delay equalized vestigial sideband filters as discussed above, the amplitude shaping and delay correction about the carrier $F_0$ by the filter and delay equalizer are the same as that desired about the television carrier $F_1$ at the final output power. The use of high power vestigial sideband filters at the final transmitter output, which are large, costly, and are not delay equalized, is avoided.

What is claimed is:

1. In combination,
   phase modulating means for phase modulating a carrier signal with an input signal to provide a first phase modulated output signal having a phase according to the arc cosine of the amplitude of said input signal with said input signal normalized with unity at the maximum possible level thereof, said phase modulating means providing a second phase modulated output signal having a phase according to the minus arc cosine of the amplitude of said input signal with said input signal normalized with unity at the maximum possible level thereof,
   first filtering means responsive to said first phase modulated signal for providing a first delay equalized vestigial sideband filtered signal,
   second filtering means substantially identical to said first filtering means and responsive to said second phase modulated signal for providing a second delay equalized vestigial sideband filtered signal,
   means coupled to said first and second filtering means for combining said first and second phase modulated signals to provide a single delay equalized vestigial sideband filtered amplitude modulated output signal.

2. The combination claimed in claim 1 including a phase shifter coupled between one of the first and second outputs from said phase modulating means and the respective one of said filtering means responsive to that one of said outputs for adjusting the relative phase of said two phase modulated signals at said combining means to achieve a selected phase difference therebetween.

3. The combination claimed in claim 2 including separate means coupled between said respective first and second filtering means and said combining means for power amplifying said first and second filtered phase modulated signals.

4. An amplitude modulation system for use in a broadcast transmitter comprising, in combination;
   phase modulating means for phase modulating a carrier signal with an input signal to provide a first phase modulated signal of a first frequency having a phase according to the arc cosine of the amplitude of said input signal with said input signal normalized with unity at the maximum possible level thereof, said phase modulating means providing a second phase modulated signal of said first frequency having a phase according to the minus arc cosine of the amplitude of said input signal with said input signal normalized with unity at the maximum possible level thereof,
   first filtering means responsive to said first phase modulated signal for providing a first delay equalized vestigial sideband filtered signal,
   second filtering means substantially identical to said first filtering means and responsive to said second phase modulated signal for providing a second delay equalized vestigial sideband filtered signal,
   first frequency translating means coupled to said first filtering means and responsive to said first filtered phase modulated signal for providing said first filtered phase modulated signal at a transmitter output frequency,
   second frequency translating means coupled to said second filtering means and responsive to said second filtered phase modulated signal for providing said second filtered phase modulated signal at said transmitter output frequency, and
   means coupled to said first and second frequency translating means for combining said first and second phase modulated signals to provide a single delay equalized vestigial sideband filtered amplitude modulated output signal at said transmitter output frequency.

5. An amplitude modulation system as claimed in claim 4 and including a phase shifter coupled between one of the first and second outputs from said phase modulating means and the respective one of said filtering means responsive to that one of said outputs for adjusting the relative phase of said two phase modulated signals at said combining means to achieve a selected phase difference between,
   separate means coupled between said respective first and second frequency translating means and said combining means for power amplifying said first and second phase modulated signals at said transmitter output frequency.

6. In an amplitude modulation system for use in a television broadcast transmitter of the type which includes a phase modulating means responsive to an input signal to provide a first phase modulated output signal having a phase determined according to the arc cosine of said input signal with said input signal normalized with unity at the maximum possible input level thereof, said phase modulating means also providing a second phase modulated output signal having a phase determined according to the - arc cosine of said input signal with said input signal normalized with unity at the maximum possible input level thereof, and means for combining said first and second phase modulated signals in a manner to provide an amplitude modulated signal, the improvement therein comprising,
   means located in said system prior to said combining means for processing the signals in said system through a delay equalized vestigial sideband filtering means in a manner to produce at the output of said combining means a delay equalized vestigial sideband filtered amplitude modulated signal.

* * * * *